United States Patent
Qian

(10) Patent No.: US 11,476,420 B2
(45) Date of Patent: Oct. 18, 2022

(54) METHOD OF FABRICATING FLEXIBLE OLED DISPLAY PANEL AND FLEXIBLE OLED DISPLAY PANEL

(71) Applicant: Shenzhen China Star Optoelectronics Semiconductor Display Technology Co., Ltd., Guangdong (CN)

(72) Inventor: Jiajia Qian, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 414 days.

(21) Appl. No.: 16/612,846

(22) PCT Filed: Sep. 18, 2019

(86) PCT No.: PCT/CN2019/106374
§ 371 (c)(1),
(2) Date: Nov. 12, 2019

(87) PCT Pub. No.: WO2021/035835
PCT Pub. Date: Mar. 4, 2021

(65) Prior Publication Data
US 2021/0343940 A1 Nov. 4, 2021

(30) Foreign Application Priority Data
Aug. 27, 2019 (CN) .......................... 201910796489.0

(51) Int. Cl.
*H01L 51/00* (2006.01)
*G06F 3/041* (2006.01)
(Continued)

(52) U.S. Cl.
CPC .............. *H01L 51/003* (2013.01); *B32B 7/12* (2013.01); *B32B 27/06* (2013.01); *B32B 27/20* (2013.01);
(Continued)

(58) Field of Classification Search
CPC . H01L 51/003; H01L 27/323; H01L 27/3244; H01L 51/0097; H01L 51/5253; H01L 51/56; B32B 7/12; G06F 3/041
(Continued)

(56) References Cited

U.S. PATENT DOCUMENTS 6,031,729 A    2/2000 Berkely et al.
2002/0177257 A1 11/2002 O'Keefe et al.
(Continued)

FOREIGN PATENT DOCUMENTS

CN    101143997 A    3/2008
CN    101798180 A    8/2010
(Continued)

*Primary Examiner* — Thinh T Nguyen

(57) ABSTRACT

A method of fabricating a flexible organic light-emitting diode (OLED) display panel, the method comprising the steps of: step S1, providing a rigid substrate on which a flexible base is formed; step S2, forming a thin film transistor array layer on the flexible base; step S3, forming an OLED display unit on the thin film transistor array layer; step S4, forming an encapsulation layer on the OLED display unit; step S5, forming a protective layer on the encapsulation layer, wherein the protective layer is adhered to a surface of the encapsulation layer away from the OLED display unit by a thermal sensitive adhesive; step S6, peeling off the rigid substrate, and completing a support film to be attached under the flexible base; step S7, removing the protective layer; and step S8, forming a protective cover on the encapsulation layer.

13 Claims, 4 Drawing Sheets

(51) Int. Cl.
- *H01L 27/32* (2006.01)
- *B32B 7/12* (2006.01)
- *B32B 27/06* (2006.01)
- *B32B 27/20* (2006.01)
- *B32B 37/12* (2006.01)
- *B32B 43/00* (2006.01)
- *H01L 51/52* (2006.01)
- *H01L 51/56* (2006.01)

(52) U.S. Cl.
CPC ............ *B32B 37/12* (2013.01); *B32B 43/006* (2013.01); *G06F 3/041* (2013.01); *H01L 27/323* (2013.01); *H01L 27/3244* (2013.01); *H01L 51/0097* (2013.01); *H01L 51/5253* (2013.01); *H01L 51/5281* (2013.01); *H01L 51/56* (2013.01); *B32B 2262/101* (2013.01); *B32B 2307/42* (2013.01); *B32B 2457/206* (2013.01); *G06F 2203/04102* (2013.01); *H01L 2227/326* (2013.01); *H01L 2251/5338* (2013.01); *H01L 2251/556* (2013.01)

(58) Field of Classification Search
USPC .......................................... 257/40; 438/82, 99
See application file for complete search history.

(56) References Cited

U.S. PATENT DOCUMENTS

| | | |
|---|---|---|
| 2008/0096762 A1 | 4/2008 | Takano et al. |
| 2008/0176012 A1 | 7/2008 | Morita et al. |
| 2012/0325402 A1 | 12/2012 | Suwa et al. |
| 2017/0210114 A1* | 7/2017 | Mu ..................... H01L 21/6838 |
| 2019/0001654 A1 | 1/2019 | Bonicatto et al. |
| 2019/0198584 A1 | 6/2019 | Chen |

FOREIGN PATENT DOCUMENTS

| | | |
|---|---|---|
| CN | 101143529 B | 12/2010 |
| CN | 102792218 A | 11/2012 |
| CN | 105514301 A | 4/2016 |
| CN | 106711355 A | 5/2017 |
| CN | 107919380 A | 4/2018 |
| CN | 107994129 A | 5/2018 |
| EP | 1255296 A2 | 11/2002 |

* cited by examiner

METHOD OF FABRICATING FLEXIBLE OLED DISPLAY PANEL AND FLEXIBLE OLED DISPLAY PANEL

FIELD OF INVENTION

The present invention relates to the field of OLED display technologies, and in particular, to a method of fabricating a flexible OLED display panel and a flexible OLED display panel thereof.

BACKGROUND OF INVENTION

Organic light-emitting diode (OLED) is a self-luminous device with many advantages, such as active illumination, high luminous efficiency, high contrast, low power consumption, wide viewing angles, fast response times, wide operating temperature range, and being light weight, etc. It has become one of widely used display devices in recent years. Therefore, flexible OLED display panels using the light-emitting device have become a mainstream product in display field.

Fabricating method of conventional flexible OLED devices generally includes the following main steps: forming a flexible base on a glass carrier, and then sequentially forming a thin film transistor back plate, an anode, a pixel definition layer, and a light-emitting layer on the flexible base, after a thin film encapsulation (TFE) was completed, the glass carrier was peeled off, that is, the fabrication of the flexible OLED devices was completed. Referring to FIG. 1, in conventional art, after the thin film encapsulation is completed, a protective layer 160 is pressed to prevent subsequent process from causing damage to a thin film encapsulation layer 150. However, after related processes are completed, while the protective layer 160 is peeled off, due to adhesion of the thin film encapsulation layer 150 is not good and adhesion of an optical clear adhesive (OCA) in the protective layer 160 is relatively large, which easily causes the thin film encapsulation layer 150 to be separated from an OLED display unit 140 that disposed under the thin film encapsulation layer, which seriously affects product yield.

Technical Problem

The flexible OLED device fabricating process forms the flexible base on the glass carrier firstly, and then sequentially fabricates the OLED device on the flexible base. After the thin film encapsulation is completed, the glass carrier is peeled off, and the process of peeling the glass carrier easily leads to strip the thin film encapsulation film layer, which seriously affects product yield.

SUMMARY OF INVENTION

Technical Solution

In order to solve the above problems of conventional art, the present invention provides a method of fabricating a flexible organic light-emitting diode (OLED) display panel, which is used to reduce stripping risk of a thin film encapsulation layer and improve production yield when a protective layer is peeled off.

Specifically, the present invention provides a method of fabricating a flexible OLED display panel, the method including the steps of: step S1, providing a rigid substrate on which a flexible base is formed; step S2, forming a thin film transistor array layer on the flexible base; step S3, forming an OLED display unit on the thin film transistor array layer; step S4, forming an encapsulation layer on the OLED display unit; step S5, forming a protective layer on the encapsulation layer, wherein the protective layer is adhered to a surface of the encapsulation layer away from the OLED display unit by a thermal sensitive adhesive; step S6, peeling off the rigid substrate, and completing a support film to be attached under the flexible base; step S7, removing the protective layer; and step S8, forming a protective cover on the encapsulation layer.

In an embodiment of the present disclosure, the protective layer in the step S5 includes the thermal sensitive adhesive.

In an embodiment of the present disclosure, the step S5 further includes: coating the thermal sensitive adhesive on the surface of the encapsulation layer away from the OLED display unit, and forming the protective layer on the thermal sensitive adhesive.

In an embodiment of the present disclosure, the step of removing the protective layer employs heating or cooling the protective layer.

In an embodiment of the present disclosure, the step of removing the protective layer includes providing a heater to heat the protective layer.

In an embodiment of the present disclosure, the heater temperature ranges from 30° C. to 85° C.

In an embodiment of the present disclosure, the step of removing the protective layer includes providing a refrigerator to cool the protective layer.

In an embodiment of the present disclosure, the refrigerator temperature ranges from −40° C. to −20° C.

In an embodiment of the present disclosure, a material of the flexible base is selected from one of polyimide, polycarbonate, polyether sulfone, polyethylene terephthalate, polyethylene naphthalate, polyaryl component, or glass fiber reinforced plastic.

To achieve the above objective, the present disclosure further provides a flexible OLED display panel, which the flexible OLED display panel includes: a thin film transistor array layer disposed on a flexible base; an OLED display unit disposed on the thin film transistor array layer; an encapsulation layer disposed on the OLED display unit; a protective layer disposed on a surface of the encapsulation layer away from the OLED display unit, wherein the protective layer includes a thermal sensitive adhesive; a support film disposed under the flexible base; and a protective cover disposed on the encapsulation layer.

In an embodiment of the present disclosure, the flexible OLED display panel further including a touch structure layer disposed between the encapsulation layer and the protective cover.

In an embodiment of the present disclosure, the flexible OLED display panel further including a polarizer disposed between the touch structure layer and the protective cover.

In an embodiment of the present disclosure, the encapsulation layer is a thin film encapsulation layer.

Beneficial Effect

Compared with the conventional art, the present invention changes the adhesive force of adhesive materials of the protective layer, and in the case of changing types of the adhesive materials of the protective layer, it is only necessary to add a heating or cooling facility in the conventional peeling process of the protective layer. In this way, stripping risk of the thin film encapsulation layer when the protective layer is peeled off can be reduced, and the production yield can be improved.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
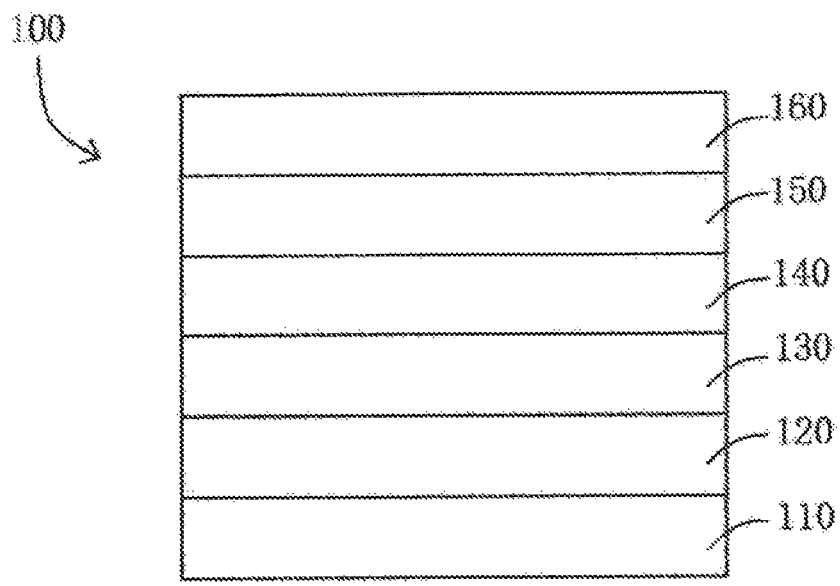
FIG. 1 is a schematic structural view of a conventional flexible organic light-emitting diode (OLED) display panel before removing a protective layer.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

In this context, it is also to be noted that in order to avoid obscuring the invention in unnecessary detail, only the structures and/or process steps which are closely related to the solution according to the invention are shown in the drawings.

Figure 2:
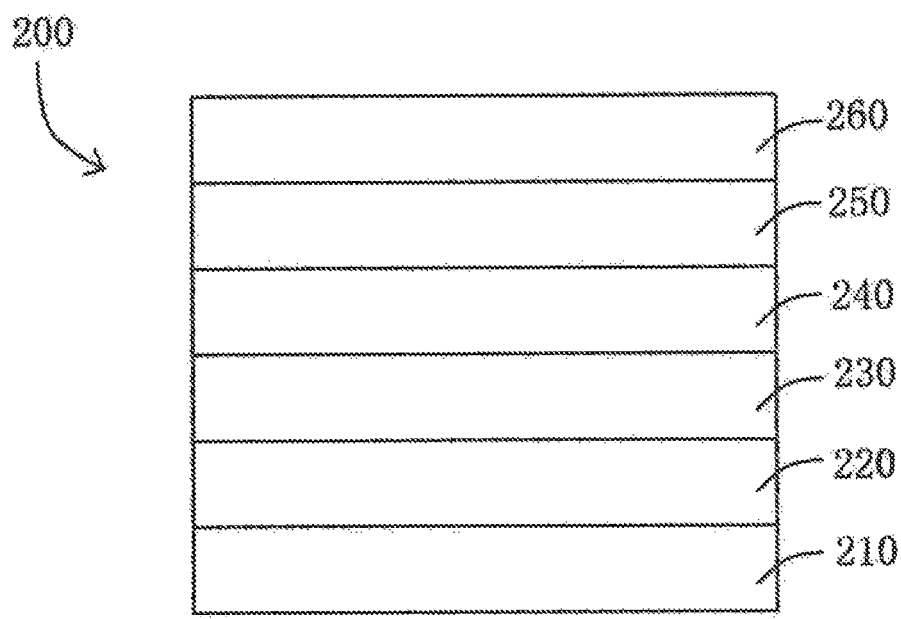
FIG. 2 is a schematic structural view of a flexible OLED display panel before removing a protective layer according to a fabricating method of an embodiment of the present invention.

Please refer to FIG. 2, where FIG. 2 is a schematic structural diagram of a method of fabricating a flexible organic light-emitting diode (OLED) display panel according to an embodiment of the present invention before removing a protective layer. In actual fabricating process, a plurality of flexible OLED display panels can be simultaneously fabricated in one mother plate, and FIG. 2 only exemplarily shows one of the flexible OLED display panels 200 for explaining the structure before removing the protective layer in the fabrication method. The flexible OLED display panel 200 includes a support film 210, a flexible base 220, a thin film transistor array layer 230, an OLED display unit 240, an encapsulation layer 250, and a protective layer 260.

Figure 3:
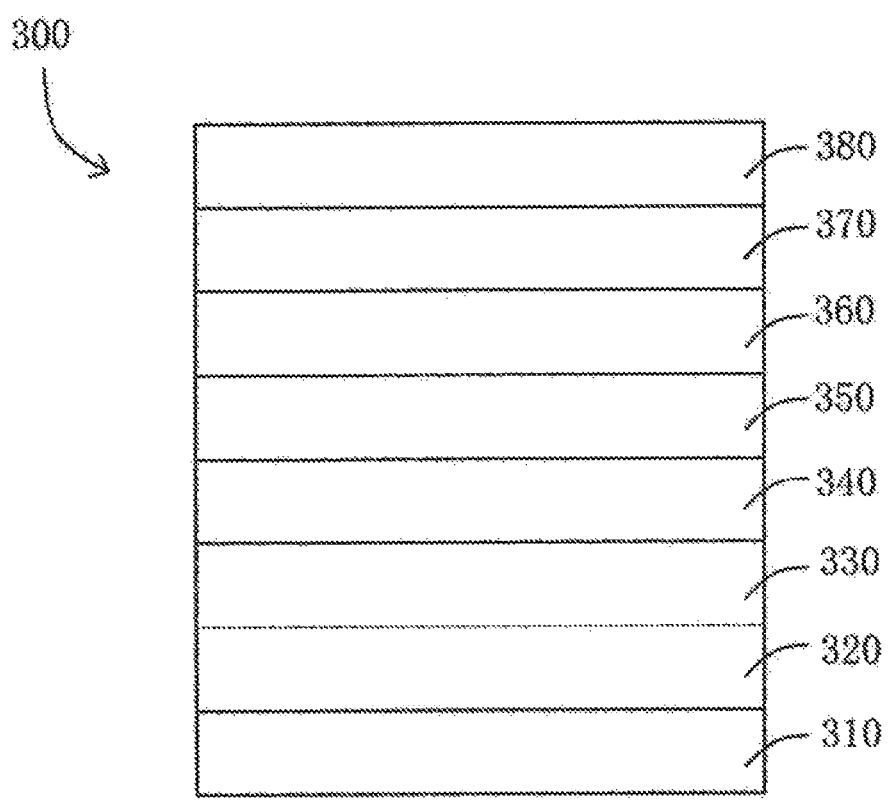
FIG. 3 is a schematic structural diagram of the flexible OLED display panel fabricated by the method according to an embodiment of the present invention.
Figure 4:
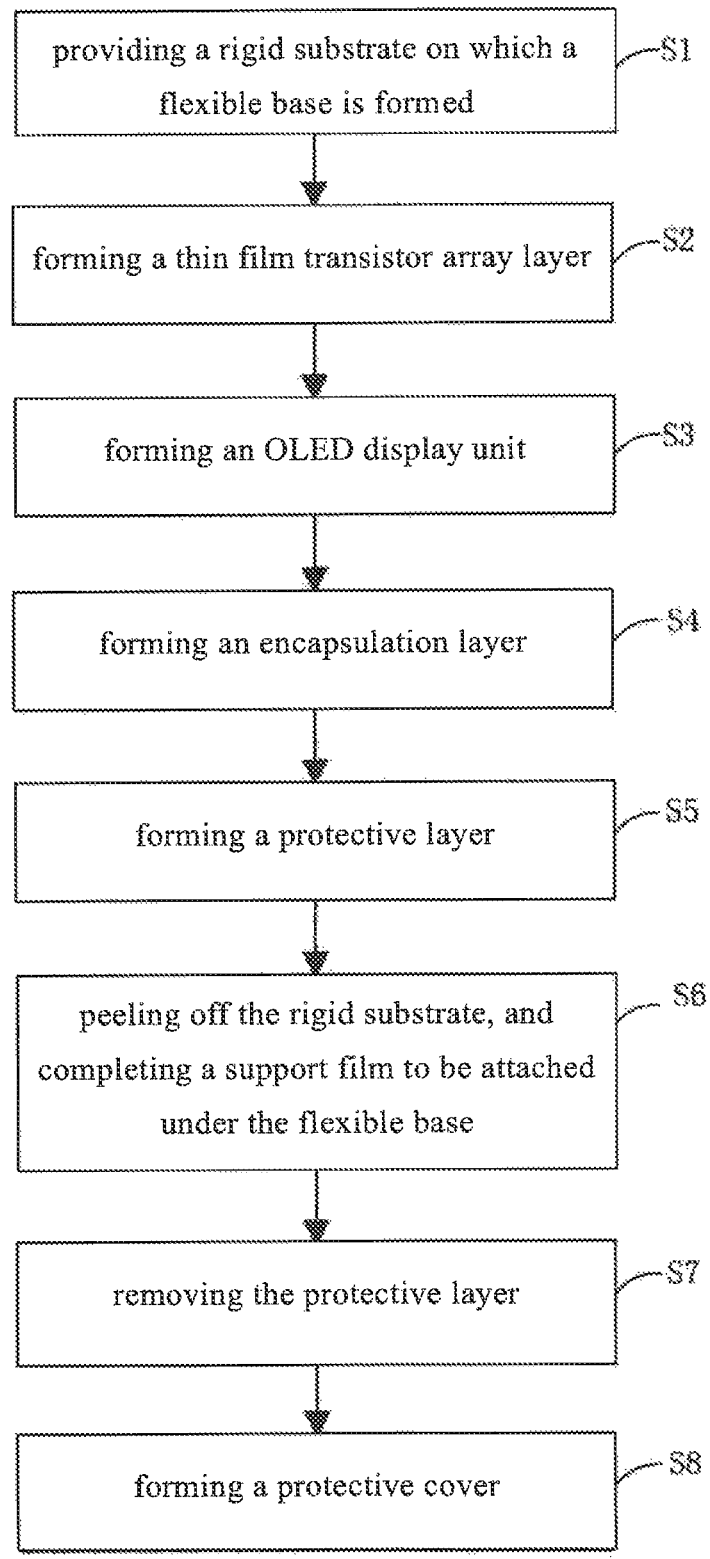
FIG. 4 is a flowchart of the method of fabricating the flexible OLED display panel according to an embodiment of the present invention.

For further explanation, please refer to FIG. 3 and FIG. 4, FIG. 3 is a schematic structural diagram of the flexible OLED display panel 300 of the present invention, and FIG. 4 is a flowchart of a method of fabricating the flexible OLED display panel of the present invention. The fabrication method provided by the embodiments of the present invention includes the steps separately described below.

A step S1 provides a rigid substrate (not shown), and the rigid substrate can be a glass substrate, a quartz substrate, or the like, and a flexible base 320 is formed by applying a coating process on the rigid substrate, and the coating process can be selected from slit coating process, spin coating process, or spraying process. A material of the flexible base is selected from one of polyimide, polycarbonate, polyether sulfone, polyethylene terephthalate, polyethylene naphthalate, polyaryl component, or glass fiber reinforced plastic.

Then, a step S2 is performed to form a thin film transistor array layer 330 on the flexible base 320. The thin film transistor array layer 330 includes a gate electrode, a gate insulating layer, a source electrode, a drain electrode, an active layer disposed between the source electrode and the drain electrode, two ends of the active layer are respectively connected to the source electrode and the drain electrode, and a planarization layer covering the source electrode, the drain electrode, and the active layer. The thin film transistor array layer 330 can be formed by thin film deposition combined with photolithography process or electronic printing process such as inkjet printing process or screen printing process.

A step S3 is performed on the thin film transistor array layer 330 to form an OLED display unit 340. The OLED display unit 340 includes an anode, an organic light-emitting layer, and a cathode. It can also be sequentially stacked a hole injection layer, a hole transport layer, the organic light-emitting layer, an electron transport layer, and an electron injection layer, etc., but are not limited thereto. The OLED display unit 340 is fabricated, for example, by an evaporation method or an electronic printing process such as an inkjet printing process or a screen printing process.

A step S4 is performed on the OLED display unit 340 to form an encapsulation layer 350. The material of the encapsulation layer 350 can be silicon oxide ($Si_xO_y$) and/or silicon nitride (SiN), where x≥1, y≥1. The $Si_xO_y$ can be, for example, SiO, $Si_2O_3$, or $Si_3O_4$. Both the $Si_xO_y$ or the SiN membranes have a certain moisture barrier capability. In other embodiments, the encapsulation layer 350 can also include a resin film, or a structure of the encapsulation layer 350 can be formed by at least one organic film and at least one inorganic film alternately disposed in a stack.

A step S5 is performed on the encapsulation layer 350 to form a protective layer (that is, the protective layer 260 of FIG. 2), and the protective layer 260 is bonded to a surface of the encapsulation layer away from the OLED display unit by a thermal sensitive adhesive (TSA).

In an embodiment, the protective layer in the step S5 includes the thermal sensitive adhesive.

In another embodiment, the step S5 further includes: forming the protective layer on the thermal sensitive adhesive, and coating the thermal sensitive adhesive on the surface of the encapsulation layer away from the OLED display unit. Among them, the coating method is not limited to a fabrication method such as spin coating or spray coating.

Thermal sensitive adhesives can be classified into high-temperature-sensitive type and low-temperature-sensitive type according to their composition characteristics. The high-temperature-sensitive thermal sensitive adhesive is such that when it is heated above a certain temperature, its viscosity is effectively lowered. In contrast, the low-temperature-sensitive thermal sensitive adhesive is effective in reducing the viscosity by cooling.

A step S6 is performed to peel off the rigid substrate, and to complete a support film 310 to be attached under the flexible base 320. The peeling method separates the rigid substrate from the flexible base 320 by, for example, a laser lift-off process. The support film 310 is then directly attached to an underside of the flexible substrate 320 through an equipment.

A step S7 is performed to remove the protective layer (that is, the protective layer 260 of FIG. 2). The temperature of the protective layer is changed by heating or cooling, and adhesion of the adhesive is lowered to effectively reduce viscosity of the adhesive in the protective layer. Therefore, when the protective layer is removed, the encapsulating layer 350 is not stripped. Meanwhile, the heating method includes providing a heater to heat the protective layer, the heater temperature ranges from about 30° C. to 85° C. The cooling method includes providing a refrigerator to cool the protective layer, the refrigerator temperature ranges from about −40° C. to −20° C.

Finally, a step S8 is performed on the encapsulation layer 350 to form a protective cover 380.

In other embodiments, the method of fabricating the flexible OLED display panel further includes a touch structure layer 360 disposed between the encapsulation layer 350 and the protective cover 380.

In other embodiments, the method of fabricating the flexible OLED display panel further includes a polarizer 370 disposed between the touch structure layer 360 and the protective cover 380.

In other embodiments, the encapsulation layer 350 is a thin film encapsulation layer.

Figure 5:
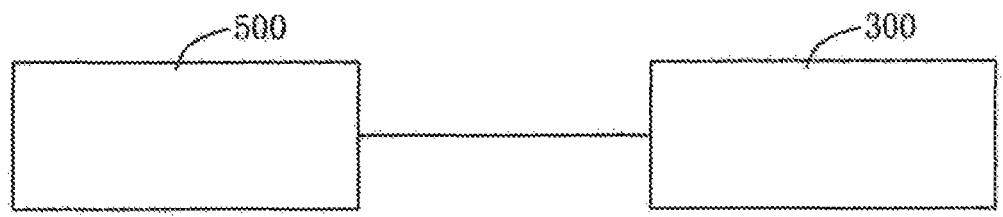
FIG. 5 is a schematic diagram of the flexible OLED display panel according to an embodiment of the present invention.

FIG. 5 is a schematic diagram of the flexible OLED display panel according to an embodiment of the present invention. The flexible OLED display panel 300 is fabricated by the aforementioned method, and a driving module 500 is electrically connected to the flexible OLED display panel 300 to control images of the flexible OLED display panel 300.

The invention is directed to the problems encountered in the fabrication process of the conventional flexible OLED devices: the adhesion between the thin film encapsulation layer and the OLED display unit is weak during the peeling process of the protective layer, and adhesion of an optical clear adhesive in the protective layer is relatively large, which easily causes the thin film encapsulation layer to be separated from the OLED display unit that disposed under the thin film encapsulation layer. A solution is proposed to change the adhesion of the protective layer, the adhesion of the protective layer is reduced when peeling off the protective layer under the premise of not affecting the main function of the protective layer, thereby reducing stripping risk of the encapsulation layer. Furthermore, by changing relevant parameters in the peeling process, thereby improving the stripped problem of the encapsulation layer of the flexible OLED display unit. The process of the invention is simple and easy, in the case of changing the type of the adhesive in the protective layer, it is only necessary to add a heating or cooling function in the conventional protective layer peeling process. In this way, stripping risk of the thin film encapsulation layer when the protective layer is peeled off can be reduced, and the production yield can be improved.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method of fabricating a flexible organic light-emitting diode (OLED) display panel, the method comprising the steps of:
   step S1, providing a rigid substrate on which a flexible base is formed;
   step S2, forming a thin film transistor array layer on the flexible base;
   step S3, forming an OLED display unit on the thin film transistor array layer;
   step S4, forming an encapsulation layer on the OLED display unit;
   step S5, forming a protective layer on the encapsulation layer, wherein the protective layer is adhered to a surface of the encapsulation layer away from the OLED display unit by a thermal sensitive adhesive, wherein the protective layer comprises the thermal sensitive adhesive, the thermal sensitive adhesive is coated on a surface of the encapsulation layer away from the OLED display unit, and the protective layer is formed on the thermal sensitive adhesive;
   step S6, peeling off the rigid substrate, and completing a support film to be attached under the flexible base;
   step S7, removing the protective layer; and
   step S8, forming a protective cover on the encapsulation layer.

2. The method of fabricating a flexible OLED display panel of claim 1, wherein the step of removing the protective layer employs heating or cooling the protective layer.

3. The method of fabricating a flexible OLED display panel of claim 2, wherein the step of removing the protective layer comprises providing a heater to heat the protective layer.

4. The method of fabricating a flexible OLED display panel of claim 3, wherein the heater temperature ranges from 30° C. to 85° C.

5. The method of fabricating a flexible OLED display panel of claim 2, wherein the step of removing the protective layer comprises providing a refrigerator to cool the protective layer.

6. The method of fabricating a flexible OLED display panel of claim 5, wherein the refrigerator temperature ranges from −40° C. to −20° C.

7. The method of fabricating a flexible OLED display panel of claim 1, wherein a material of the flexible base is selected from one of polyimide, polycarbonate, polyether sulfone, polyethylene terephthalate, polyethylene naphthalate, polyaryl component, or glass fiber reinforced plastic.

8. A method of fabricating a flexible organic light-emitting diode (OLED) display panel, the method comprising the steps of:
   step S1, providing a rigid substrate on which a flexible base is formed;
   step S2, forming a thin film transistor array layer on the flexible base;
   step S3, forming an OLED display unit on the thin film transistor array layer;
   step S4, forming an encapsulation layer on the OLED display unit;
   step S5, forming a protective layer on the encapsulation layer, wherein the protective layer is adhered to a surface of the encapsulation layer away from the OLED display unit by a thermal sensitive adhesive, and the protective layer comprises the thermal sensitive adhesive, wherein the protective layer comprises the thermal sensitive adhesive, the thermal sensitive adhesive is coated on a surface of the encapsulation layer away from the OLED display unit, and the protective layer is formed on the thermal sensitive adhesive;

step S6, peeling off the rigid substrate, and completing a support film to be attached under the flexible base;

step S7, removing the protective layer, which employs heating or cooling the protective layer; and step S8, forming a protective cover on the encapsulation layer.

9. The method of fabricating a flexible OLED display panel of claim 8, wherein the step S7 comprises providing a heater to heat the protective layer.

10. The method of fabricating a flexible OLED display panel of claim 9, wherein the heater temperature ranges from 30° C. to 85° C.

11. The method of fabricating a flexible OLED display panel of claim 8, wherein the step S7 comprises providing a refrigerator to cool the protective layer.

12. The method of fabricating a flexible OLED display panel of claim 11, wherein the refrigerator temperature ranges from −40° C. to −20° C.

13. The method of fabricating the flexible OLED display panel of claim 1, wherein the encapsulation layer comprises silicon oxide and/or silicon, a resin film, an alternately stacked structure of at least one organic film and at least one inorganic film.

\* \* \* \* \*